(12) United States Patent
Tsukamoto et al.

(10) Patent No.: US 6,703,565 B1
(45) Date of Patent: Mar. 9, 2004

(54) PRINTED WIRING BOARD

(75) Inventors: Masahide Tsukamoto, Nara (JP);
Masanaru Hasegawa, Kyoto (JP);
Hideo Hatanaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/686,220

(22) Filed: Oct. 11, 2000

Related U.S. Application Data

(63) Continuation of application No. 08/924,619, filed on Sep. 5, 1997, now Pat. No. 6,195,882.

(30) Foreign Application Priority Data

Sep. 6, 1996 (JP) ............................................. 8-236142

(51) Int. Cl.⁷ ................................................ H05K 1/02
(52) U.S. Cl. ........................... 174/259; 29/829; 29/830; 29/831; 156/233; 156/272.2; 156/272.3; 156/272.5; 156/289; 156/344; 174/264; 174/265
(58) Field of Search ...................... 29/829, 852, 830–1, 29/831; 174/264, 255, 256, 259; 156/233, 272.2, 273.3, 275.5, 289, 344

(56) References Cited

U.S. PATENT DOCUMENTS

| | | |
|---|---|---|
| 3,264,402 A | 8/1966 | Shaheen et al. |
| 4,372,804 A * | 2/1983 | Hanabusa et al. ........... 156/631 |
| 4,383,363 A | 5/1983 | Hayakawa et al. ............ 29/847 |
| 4,648,179 A | 3/1987 | Bhattacharyya et al. ...... 29/832 |
| 4,678,963 A | 7/1987 | Fonda ......................... 313/405 |
| 4,865,888 A * | 9/1989 | Akahoshi et al. ......... 427/443.1 |
| 5,046,238 A * | 9/1991 | Daigle .......................... 29/830 |
| 5,326,966 A * | 7/1994 | Fukuda et al. ............... 235/493 |
| 5,346,750 A | 9/1994 | Hatakeyama et al. |

(List continued on next page.)

FOREIGN PATENT DOCUMENTS

| | | |
|---|---|---|
| EP | 568 930 | 11/1993 |
| FR | 2 134436 | 12/1972 |
| JP | 2 134436 | 12/1972 |
| JP | 2 283094 | 11/1990 |
| JP | 6 21619 | 1/1994 |
| JP | 6 268345 | 9/1994 |
| JP | 6 318783 | 11/1994 |
| JP | 7 147464 | 6/1995 |
| JP | 7 263828 | 10/1995 |
| JP | 8 213757 | 8/1996 |
| JP | 10 84186 | 9/1996 |
| JP | 8 255982 | 10/1996 |
| JP | 8 287840 | 11/1996 |
| JP | 8 298078 | 11/1996 |
| JP | 2 601128 | 1/1997 |
| JP | 10 13028 | 1/1998 |
| JP | 6 356991 | 3/1998 |
| JP | 2000 77800 | 3/2000 |

OTHER PUBLICATIONS

N. Fukutomi et al. "Development of Fine Line Printed Wiring Technology by Plated Wiring Pattern Transfer Method" *The Institute of Electronics, Information and Communication Engineers*, C–II, vol. J72–C–II, No. 4 pp. 243–253 (with English abstract).

*Primary Examiner*—Peter Vo
*Assistant Examiner*—Paul Kim
(74) *Attorney, Agent, or Firm*—Merchant & Gould P.C.

(57) ABSTRACT

A printed wiring board includes at least one insulator sheet having through holes filled with conductive material and a conductive wiring pattern. The wiring pattern is embedded in the insulator sheet so that an upper surface of the wiring pattern and surrounding portions of the insulator sheet form a flat surface. The insulator sheet may be made from a glass-epoxy prepreg or of a polyester or polyimide sheet coated with an adhesive or glue. The wiring pattern can be transferred to the insulator sheet from a surface of a releasable supporting sheet.

10 Claims, 5 Drawing Sheets

U.S. PATENT DOCUMENTS

| | | | |
|---|---|---|---|
| 5,359,259 A | 10/1994 | Reidinger et al. | 323/407 |
| 5,374,469 A * | 12/1994 | Hino et al. | 428/209 |
| 5,407,511 A | 4/1995 | Nakatani et al. | 156/230 |
| 5,440,075 A | 8/1995 | Kawakita et al. | 174/265 |
| 5,478,972 A | 12/1995 | Mizutani et al. | 174/250 |
| 5,480,503 A | 1/1996 | Casey et al. | |
| 5,481,795 A | 1/1996 | Hatakeyama et al. | |
| 5,484,647 A | 1/1996 | Nakatani et al. | |
| 5,498,467 A | 3/1996 | Meola | |
| 5,576,519 A | 11/1996 | Swamy | |
| 5,595,943 A * | 1/1997 | Itabashi et al. | 427/437 |
| 5,652,042 A * | 7/1997 | Kawakita | 428/209 |
| 5,707,925 A * | 1/1998 | Akada et al. | 503/227 |
| 5,719,354 A * | 2/1998 | Jester | 174/255 |
| 5,744,758 A | 4/1998 | Takenouchi et al. | |
| 5,860,818 A * | 1/1999 | Sakaki et al. | 439/91 |
| 5,914,358 A | 6/1999 | Kawakita et al. | 523/458 |
| 5,937,725 A * | 8/1999 | Kamijo et al. | 83/880 |
| 5,950,306 A | 9/1999 | Suzuki et al. | 29/852 |
| 5,956,843 A | 9/1999 | Mizumoto et al. | 29/852 |
| 6,051,918 A | 4/2000 | Hayashi et al. | 313/407 |
| 6,137,054 A * | 10/2000 | Uezono et al. | 174/59 |
| 6,143,116 A * | 11/2000 | Hayashi et al. | 156/233 |
| 6,197,407 B1 | 3/2001 | Andou et al. | 428/209 |
| 6,224,965 B1 | 5/2001 | Haas et al. | 428/209 |
| 6,242,079 B1 | 6/2001 | Mikado et al. | 428/209 |
| 6,329,610 B1 | 12/2001 | Takubo et al. | 174/264 |
| 6,353,189 B1 | 3/2002 | Shimada et al. | 174/255 |
| 6,365,843 B1 | 4/2002 | Shirai et al. | 174/262 |

* cited by examiner

PRINTED WIRING BOARD

This application is a continuation of application Ser. No. 08/924,619, filed Sep. 5, 1997, now U.S. Pat. No. 6,195,882 which application(s) are incorporated herein by reference.

BACKGROUND OF THE INVENTION

The present invention relates to a method for producing printed wiring boards (PWBs), especially double-side PWBs or multilayer PWBs.

Recently, a low cost multilayer PWB that enables high-density mounting of semiconductor chips such as LSIs has been desired for industrial machines as well as home electronic appliances. It is important for such multilayer PWBs to provide high quality electric connections between plural layers of wiring patterns formed at a fine spacing or pitch.

The conventional PWB that is produced by drilling, etching and plating a copper-foil laminated board cannot satisfy the above-mentioned need anymore for sophisticated electronic equipment having a number of functions. To solve such a problem, some methods are under development for producing PWBs that have a new structure and a high density of wiring.

One of the methods is a recent technique for forming a fine pattern that can be applied to a high-density surface mounting. This method for producing PWBs utilizes a plating technique and a transferring technique for the wiring pattern. Two metal sheets are prepared, each of which has a surface with a wiring pattern formed by electroplating of copper. A semi-hardened resin sheet such as a prepreg is placed between the wiring patterns of the metal sheets. Heat and pressure are applied to the outer surfaces of the metal sheets. Thus, the copper wiring patterns are transferred from the surfaces of the metal sheets to the surfaces of the resin sheet. After removing the metal sheets, through holes are formed by drilling in the resin sheet, and copper plating is performed inside the through holes to connect the wiring pattern on one side with that of the other side electrically (Naoki Hukutomi et al. "Development of Fine Pattern Wiring Technique", The Institute of Electronics, Information and Communication Engineers, C-II, Vol. J72-C-II, No. 4, PP243–253, 1989). This method provides a line width and a line space of 20 microns each.

There is another technique called "ALIVH" (a trademark of Matsushita Electric Industrial Co., Ltd.), that is a resin-based multilayer PWB having an inner via hole (IVH) structure for all layers. In this multilayer PWB, a conductive material is filled in the inner via holes instead of copper plating inside the through holes that is a major method for electric connection between layers of a multilayer PWB in the prior art. This "ALIVH" PWB thus improves the reliability of the electric connection between layers, and facilitates forming inner via holes under lands for mounting components or between any layers (U.S. Pat. Nos. 5,346,750 and 5,481,795).

An example of the method for producing the "ALIVH" PWB is explained below, referring to FIGS. 5A–5F that show cross sections in the producing process. As shown in FIG. 5A, via holes 502 are perforated by using a laser beam machine at predetermined positions in an adhesive insulator sheet 501 that comprises an aramid-epoxy prepreg made of a non-woven aramid sheet impregnated with an epoxy resin. Then, as shown in FIG. 5B, the via holes 502 are filled with a fluid conductive paste 503. Then, as shown in FIG. 5C, the adhesive insulator sheet 501 with via holes filled with the conductive paste is placed between copper foils 504, and heat and pressure are applied to the outer surfaces of the copper foils. Thus, the adhesive insulator sheet (the prepreg) 501 and the conductive paste 503 are hardened, the copper foils 504 adhere to the surfaces of the adhesive insulator sheet 501, and electrical connections are formed between the copper foils by the conductive paste 503 packed into the via holes 502. The copper foils 504 are etched by a conventional photolithography method to form wiring patterns 505a, 505b. Thus, a double-side PWB 506 is obtained as shown in FIG. 5D.

In the next step shown in FIG. 5E, the double-side PWB 506 is used as a core, and on both sides of the core PWB 506 other adhesive insulator sheets 501a and 501b are placed with proper registration. These adhesive insulator sheets 501a, 501b have been made previously according to the step shown in FIG. 5B, and each of them has via holes filled with the conductive paste at predetermined positions. On the outer surfaces of the adhesive insulator sheets 501a and 501b, copper foils 507a and 507b are placed. Heat and pressure are applied to both outer surfaces of the copper foils 507a, 507b for lamination. Then, similarly to the step of FIG. 5D, the outer copper foils 507a, 507b are etched by the photolithography method. Thus a four-layer PWB is obtained having the outer wiring patterns 508a, 508b as shown in FIG. 5F. This method for producing PWBs enables via-connections (electric connections between layers) with very small via holes since via holes are formed by a laser beam and filled with the fluid conductive paste for the electric connection.

However, in the above-mentioned transferring technique of the wiring pattern, there is a limit for reducing the size of through holes since they are perforated by machining. On the other hand, in the above "ALIVH" PWB, there is a limit on the fineness of patterns with respect to pattern density such as a line pitch and a line width since the outer and inner copper patterns are formed by the conventional photolithography method. These limits are obstacles to producing high density mounting of surface mount components, especially small electronic components such as recent chip components or LSI bare chips.

SUMMARY OF THE INVENTION

The present invention provides a method for producing fine pattern PWBs that enables high density mounting of components by combining the advantage of the conventional transferring method of wiring patterns and the advantage of the conventional "ALIVH" structured multilayer PWB.

The method for producing PWBs according to the present invention comprises the steps of perforating through holes at predetermined positions in an adhesive insulator sheet, filling the through holes with a conductive material, forming conductive wiring patterns on surfaces of releasable supporting sheets, and transferring the conductive wiring patterns from the surface of the releasable supporting sheets onto surfaces of the adhesive insulator sheet so as to form the wiring patterns on the surfaces of the adhesive insulator and perform electric connections between the wiring patterns of plural layers.

According to the present invention, PWBs can be produced with fine patterns defining very fine wiring pitches and electric connections by very small via holes. In addition, such fine PWBs can be produced at a low cost since the method according to the present invention is simple compared with other conventional methods.

Another method according to the present invention uses the PWB produced by the method mentioned above as a core. Second adhesive insulator sheets are prepared that have through holes filled with a conductive material. These second adhesive insulator sheets are placed on surfaces of the core PWB. On the outer surfaces of the second adhesive insulator sheets, second releasable supporting sheets are placed, whose surfaces facing the second adhesive insulator sheets are provided with second conductive wiring patterns. The second conductive wiring patterns are transferred from the surfaces of the second releasable supporting sheets onto the surfaces of the second adhesive insulator sheets so as to form surface wiring patterns and perform electric connection between the surface wiring patterns and the inner wiring patterns. Thus, multilayer PWBs with fine patterns can be produced inexpensively. By repeating the steps mentioned above, PWBs having more layers can be produced easily.

Another method according to the present invention uses a double-side or multilayer PWB produced by a conventional method as a core. Adhesive insulator sheets that have via holes filled with a conductive material are placed on surfaces of the core PWB. Conductive wiring patterns on surfaces of releasable supporting sheets are transferred onto outer surfaces of the adhesive insulator sheets so as to form surface wiring patterns and perform electric connection between the surface wiring patterns and the inner wiring patterns. Also in this method, PWBs having more layers can be produced easily by repeating the steps mentioned above.

In each method mentioned above, it is preferable to use a fluid conductive paste as the conductive material to be packed into the through holes. The use of the fluid conductive paste enables reliable electric connections with very small via holes.

It is preferable that conductive sheets are used as the releasable supporting sheets and the conductive wiring patterns are formed by electroplating after forming resist films on surfaces of the releasable supporting sheets. Finer patterns can be obtained by electroplating after printing fine resist pattern than etching conductive layer. Furthermore, production cost may be reduced because of less waste of conductive material.

Alternatively, the conductive wiring pattern can be formed by printing a conductive paste on the surface of the releasable sheet. This method enables formation of conductive wiring patterns at a low cost.

It is also preferable that insulated and via-connected multilayer wiring patterns are formed in the step of forming wiring patterns on the surface of releasable supporting sheets. This produces PWBs having plural inner wiring patterns at a single transferring.

It is preferable to use a semi-hardened resin insulator as the adhesive insulator sheet. This semi-hardened insulator sheet becomes hardened completely when the heat and pressure are applied for transferring the wiring pattern from the surface of the releasable supporting sheet onto the surface of the adhesive insulator sheet. Thus, a large adhesion strength is obtained between the conductive wiring pattern and the hardened insulator sheet.

The adhesive insulator sheet is preferably made of a porous and compressible semi-hardened material. This adhesive insulator sheet is compressed when the heat and pressure are applied for transferring the wiring pattern from the surface of the releasable supporting sheet onto the surface of the adhesive insulator sheet. Simultaneously, the conductive material in the via holes is compressed so that reliable via-connections with good conductivity can be obtained.

More preferably, the adhesive insulator sheet is made of a prepreg that is a non-woven aramid sheet impregnated with an epoxy resin. This material has ideal properties of transferring ability and compressibility. Since this material has light weight and its thermal expansivity is as low as a ceramic PWB, PWBs of high utility with low dielectric constant and high resistance to heat are obtained.

In each method for producing PWBs mentioned above, it is preferable to use heat and pressure for transferring the conductive pattern from the surface of the releasable supporting sheet onto the surface of the adhesive insulator sheet and hardening the adhesive insulator sheet completely. The heat and pressure make the conductive wiring pattern transfer and adhere securely to the surface of the adhesive insulator sheet. Thus, the PWB produced by this method has a fine wiring pattern and high mechanical strength due to the promoted cure of the adhesive insulator.

The PWB according to the present invention comprises an adhesive insulator sheet having through holes filled with a conductive material, a conductive wiring pattern that is formed on the surface of the adhesive insulator sheet by the transferring method and is connected with the conductive material in the via holes, wherein the conductive wiring pattern is embedded in the adhesive insulator sheet so as to form a flat surface. Such a PWB is suitable for flip mounting of LSI chips since the surface of the PWB is flat.

It is preferable that a width of the conductive wiring pattern formed on the adhesive insulator sheet is smaller than a diameter of the via hole at least where the conductive wiring pattern is overlaid on the via hole. This configuration can relieve a maximum allowable limit of pattern deviation, which is critical for PWBs with fine patterns.

DETAILED DESCRIPTION OF THE PREFERRED EMBODIMENTS (First Embodiment)

A first embodiment of the present invention is illustrated in FIG. 1A–1E, which are cross sections showing a process for producing a PWB.

Figure 1A:
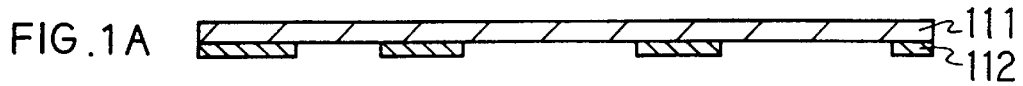
FIG. 1A–1E are cross sections showing a process for producing a PWB according to a first embodiment of the present invention.

In FIG. 1A, numeral 111 is a releasable supporting sheet, preferably made of a metal sheet such as a stainless steel having properly rough surface. In the step of FIG. 1A, a patterned resist film 112 is formed on the rough surface of the releasable supporting sheet.

Figure 1B:

In the step of FIG. 1B, a wiring pattern 113 is formed by electroplating on the rough surface of the releasable supporting sheet except the area where the resist film has been formed, and then the resist film is removed.

Figure 1C:
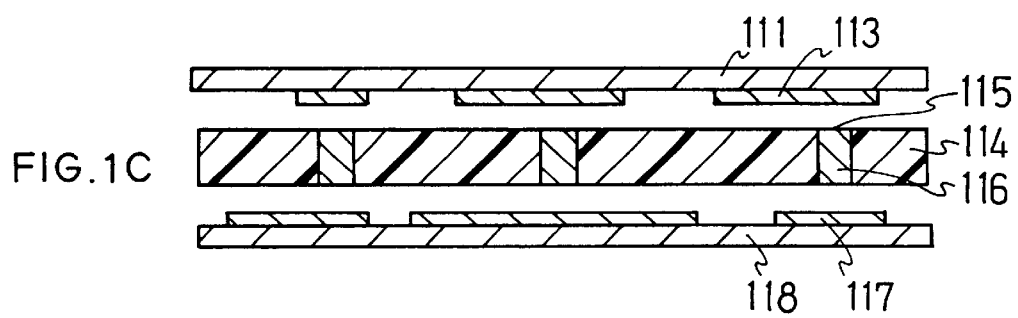

In FIG. 1C showing the next step, numeral 114 is an adhesive insulator sheet, preferably made of an aramid-epoxy prepreg that is a non-woven aramid sheet impregnated with an epoxy resin. The aramid-epoxy prepreg is a porous semi-hardened sheet having compressive and adhesive properties suitable for forming fine pattern and via-connection of high reliability according to the present invention. It also has an advantage in that the electric resistance of the via-connection becomes small.

The adhesive insulator sheet 114 has small through holes 115, which are filled with a conductive material 116. The diameter of the through holes is approximately 150 microns when using a carbon dioxide laser, and can be 30–50 microns by using an excimer laser. A fluid conductive paste whose viscosity is 1,000–3,000 poise is suitable for the conductive material 116. Such a conductive paste contains copper powder, resin and hardener.

Figure 1D:
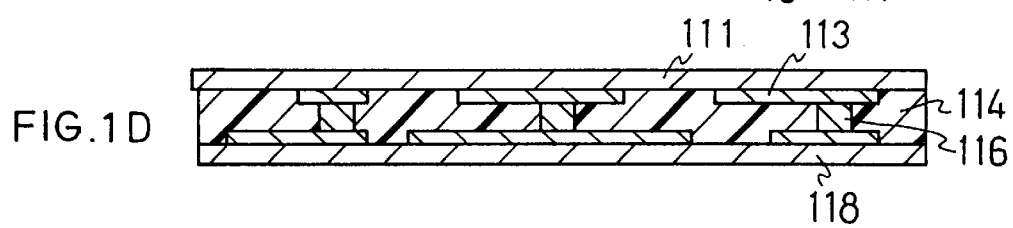

As shown in FIG. 1D, the releasable supporting sheet 111 that has the wiring pattern 113 and the releasable supporting sheet 118 that has the wiring pattern 117 are put on the surfaces of the adhesive insulator sheet 114. Then, predetermined heat and pressure are applied to this laminated sheet by a heating and pressing machine (not shown) for a predetermined period. In this heating and pressing step, the adhesive insulator sheet 114 is compressed and hardened completely, and the conductive material 116 in the through holes are also compressed to a higher density, resulting in higher conductivity between the wiring pattern 113 and the wiring pattern 117.

Figure 1E:
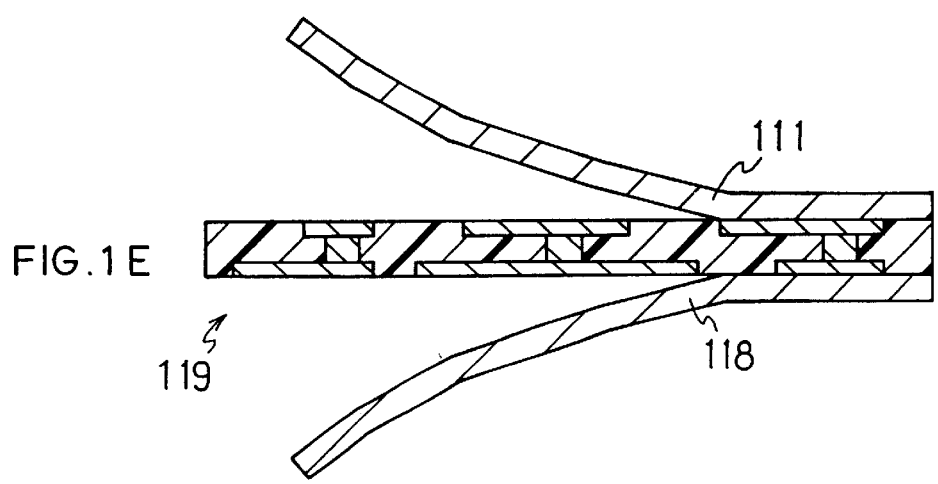

In the next step shown in FIG. 1E, the releasable supporting sheets 111, 118 are removed. Consequently, a double-side PWB 119 is obtained that includes the wiring patterns 113, 117 embedded in the insulator to make flat surfaces, and the conductive material 116 that forms interlayer connections (i.e., via connections).

Instead of forming wiring a pattern previously on the releasable supporting sheet 111 or 118, a thin releasable copper film may be formed on the releasable supporting sheet, the copper film may be transferred onto the surface of the adhesive insulator sheet in the heating and pressing step, and the copper film may be etched to make a wiring pattern. This method has merit in that it can make a fine pattern stably, although it needs more steps. This method should be included in the scope of the present invention.

The conductive material 116 is not always required to be a conductive paste. For example, it can be solder balls, gold balls or other metals.

If the wiring patterns 113, 117 are formed by printing a conductive paste, the releasable supporting sheet can be an insulator sheet such as a polyester instead of the conductive sheet such as a stainless steel sheet. The surface of the sheet may be processed to have good property for releasing.

The adhesive insulator sheet 114 is not limited to the above-mentioned aramid-epoxy prepreg, i.e., the non-woven aramid sheet impregnated with an epoxy resin. It may be a glass-epoxy prepreg or other adhesive insulator made of polyester, polyimide or other sheet coated with an adhesive or glue.

According to the present invention, double-side or multilayer PWBs can be produced easily, which have fine patterns with a line width and spacing of 30 microns, and via-connections of the wiring patterns that are formed at the same time as the transferring of the wiring patterns.

Figure 2A:
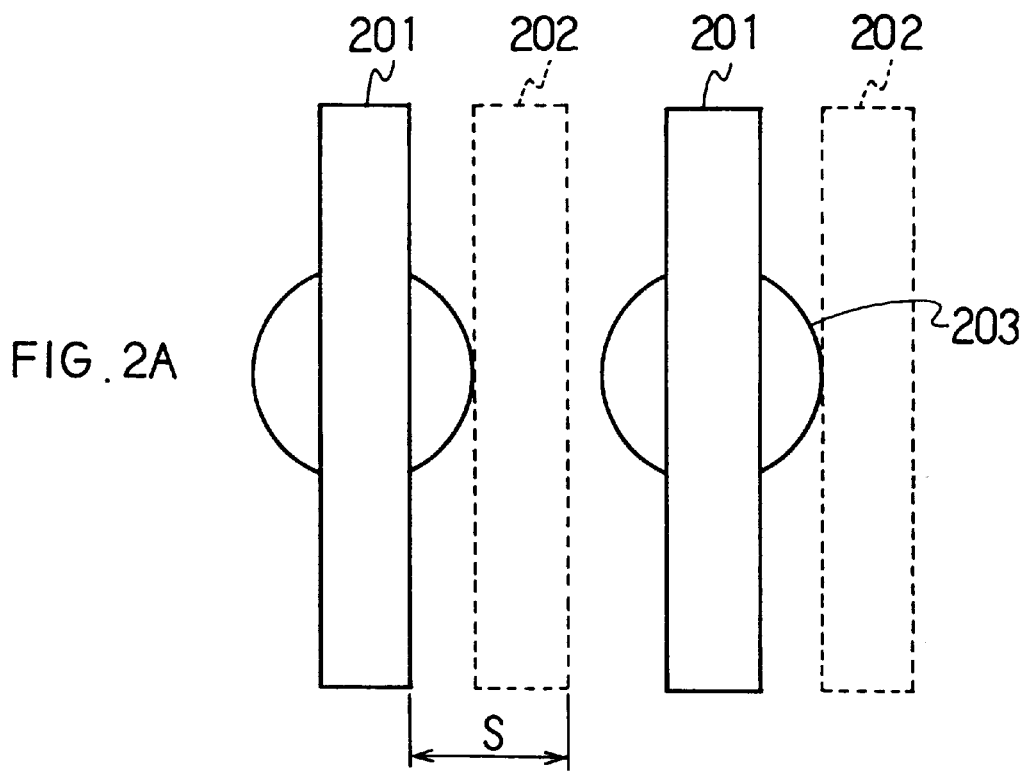
FIG. 2A shows an allowable deviation of a wiring pattern from a via hole according to the present invention.
Figure 2B:
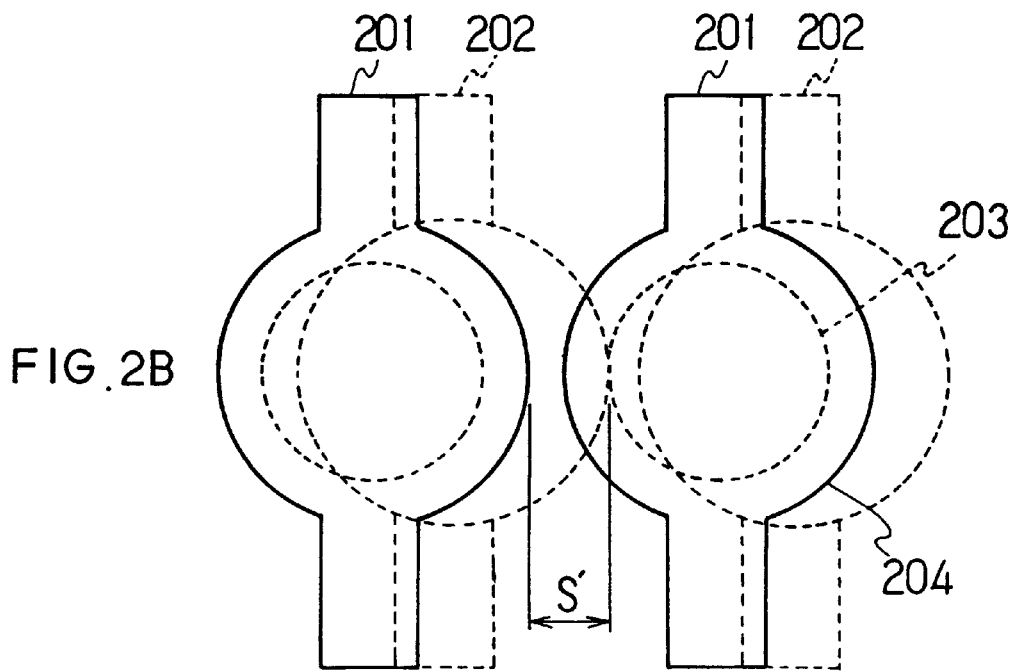
FIG. 2B shows an allowable deviation of a wiring pattern from a via hole in the prior art.

In FIG. 1, the width of the wiring pattern 113 (via pad) at the via-connection point is not always larger than the diameter of the through hole 115. Registration of the fine wiring pattern with the via hole may be easier by making the width of the wiring pattern smaller than the diameter of the through hole 115. This reason is illustrated in FIG. 2A and 2B. FIG. 2A shows wiring patterns 201 on through holes 203 filled with the conductive material. The width of the wiring pattern 201 is smaller than the diameter of the through hole 203. The wiring pattern 201 also serves as a via pad.

Since the method for producing PWBs according of the present invention forms wiring patterns by transferring without etching step, the above-mentioned configuration with smaller pattern width than the hole diameter is possible. In the case of FIG. 2A, even if the wiring pattern 201 is shifted to the position 202 shown in the broken line, electric connection between them is still obtained.

On the contrary, if the wiring pattern is formed by etching of a copper foil instead of transferring, the via hole (through hole) should be covered with a via pad as shown in FIG. 2B. Otherwise the conductive material in the via hole may be eroded by an etchant. In FIG. 2B, if the via pad 201 is shifted to the position 202 shown with the broken line, it may contact with the neighboring via pad and make a short circuit. Therefore the allowable deviation S' in this case is smaller than that S in FIG. 2A.

Since the width of the wiring pattern can be smaller than the diameter of the via hole, registration of patterns is easy in the production process, and thus PWBs according to the present invention can be produced inexpensively.

(Second Embodiment)

Figure 3A:
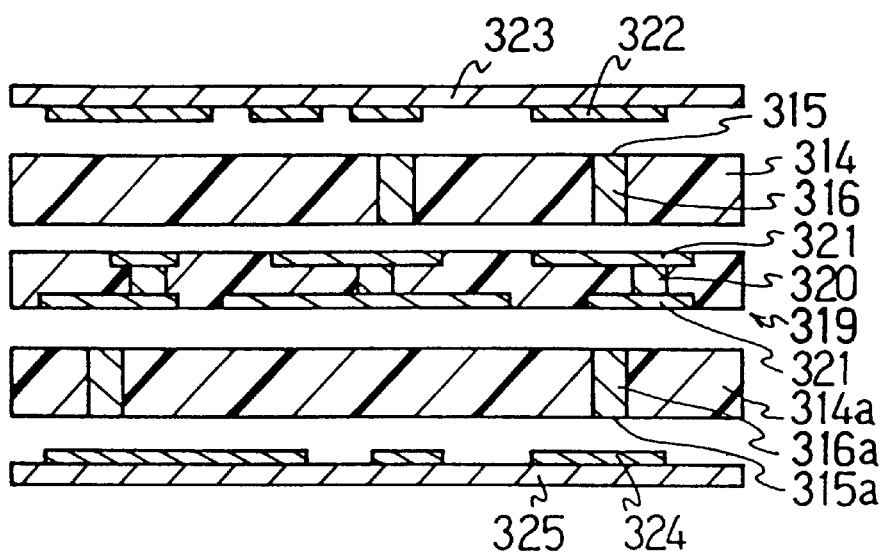
FIG. 3A–3C are cross sections showing a process for producing a PWB according to a second embodiment of the present invention.
Figure 3B:
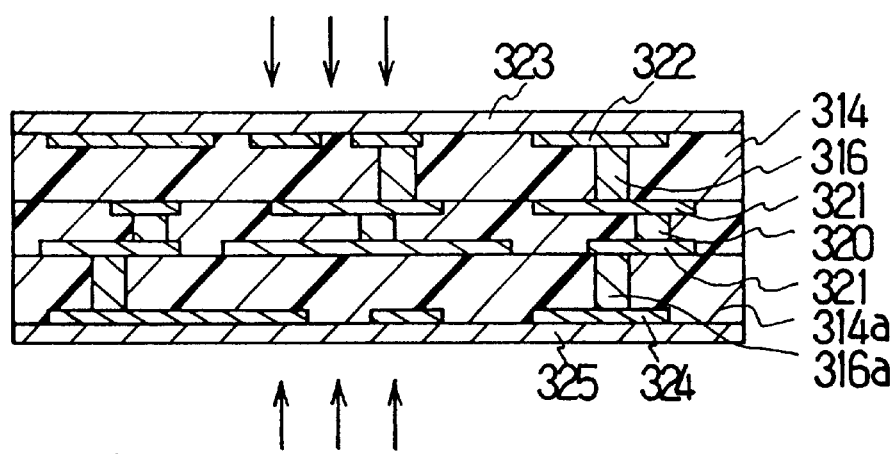
Figure 3C:
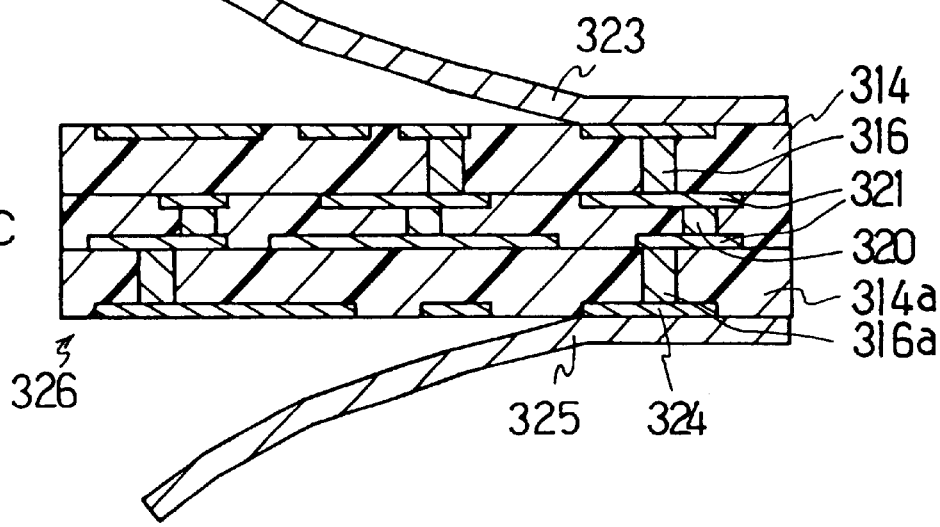

FIGS. 3A–3C are cross sections showing production steps of PWBs according to a second embodiment of the present invention.

In FIG. 3A, numeral 319 is a double-side PWB prepared for this step, which includes double-side printed wiring patterns 321 connected electrically with each other with via holes 320. On one side of the PWB an adhesive insulator sheet 314 is placed, which has through holes filled with a conductive material 316 as explained in the first embodiment (e.g., an aramid-epoxy prepreg). Similarly, on another side of the PWB an adhesive insulator sheet 314a is placed, which has through holes 315a filled with a conductive material 316a. The two adhesive insulator sheets 314, 314a are made of the same materials but have different positions for the through holes 315, 315a in accordance with the corresponding wiring patterns.

Then, a first releasable supporting sheet 323 whose surface is provided with a first wiring pattern 322 is placed on the outer surface of the adhesive insulator sheet 314. Similarly, a second releasable supporting sheet 325 whose surface is provided with a second wiring pattern 324 is placed on the outer surface of the adhesive insulator sheet 314a.

As shown in FIG. 3B, a predetermined heat and pressure are applied on the sides for a predetermined period by a vacuum press machine (not shown) as illustrated in FIG. 3B. For example, if an aramid-epoxy prepreg is used, the laminated sheet is kept at 30 Kg/cm$^2$ and 180 degrees Celsius for one hour. Thus, the adhesive insulator sheets 314, 314a and the conductive material 316, 316a in the through holes 315, 315a are compressed and hardened completely. The first wiring pattern 322 and one of wiring patterns 321 of the double-side wiring PWB 319 are connected electrically with the conductive material 316. Similarly, the second wiring pattern 324 and the other wiring pattern 321 of the double-side wiring PWB 319 are connected electrically with the conductive material 316a.

In the next step shown in FIG. 3C, the first and second releasable sheets 322, 324 are removed. As a result, a multilayer PWB 326 is obtained, which has a four-layer wiring pattern including the first and second wiring patterns 322, 324 that are flush with the surfaces of the insulator.

In the above explained embodiment, the double-side PWB 319 as a core can be previously produced in accordance with the first embodiment. Alternatively, it may be a double-side or multilayer PWB made of a paper-phenol or a glass-epoxy in accordance with a conventional method. In this case, double-side or multilayer PWBs with a fine pattern (e.g., 30 microns of line width and space) at least on one side can be produced at a low cost by using an inexpensive PWB produced by a conventional method as a core.

(Third Embodiment)

Figure 4:
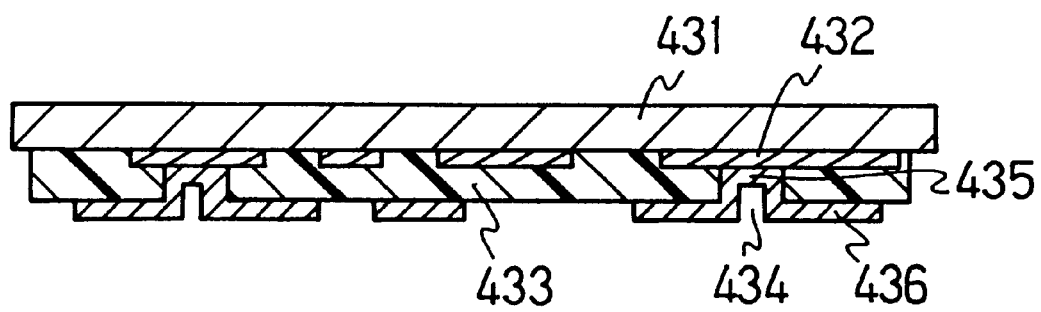
FIG. 4 is a cross section of a releasable supporting sheet used for producing a PWB according to a third embodiment of the present invention.
Figure 5A:
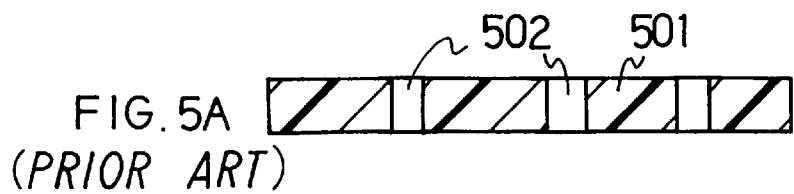
FIG. 5A–5F are cross sections showing a process for producing a PWB in the prior art.
Figure 5B:
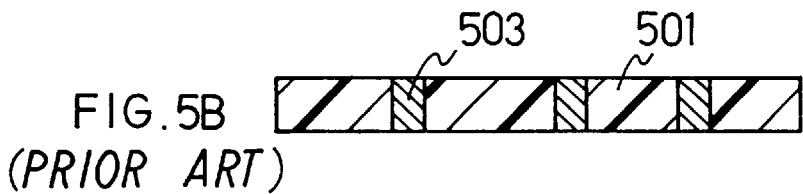
Figure 5C:
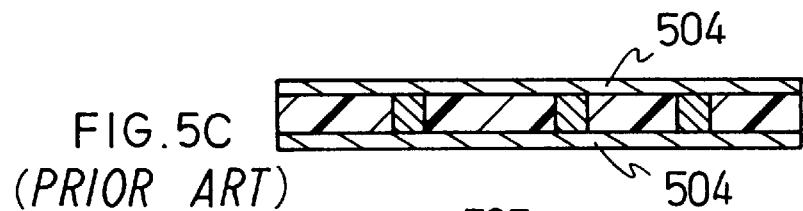
Figure 5D:
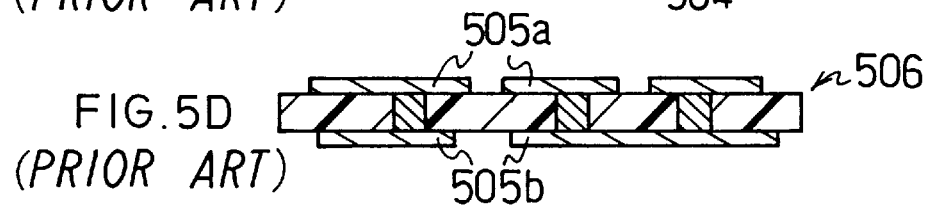
Figure 5E:
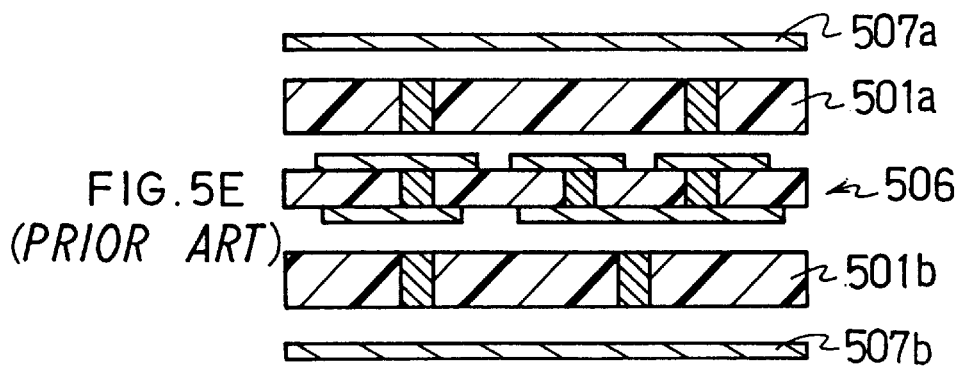
Figure 5F:
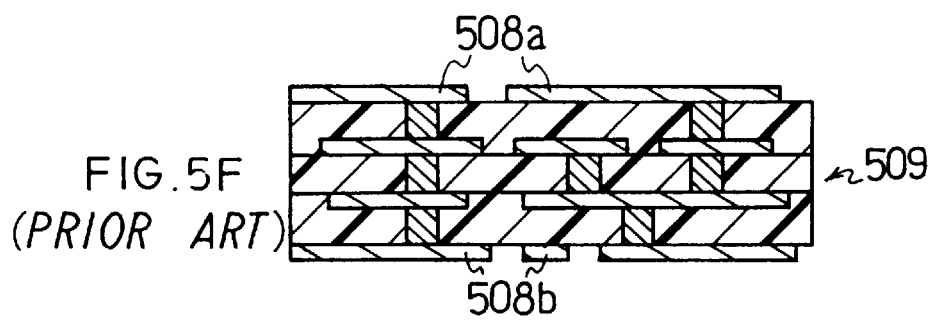

FIG. 4 is a cross section of a releasable supporting sheet used for producing a PWB according to a third embodiment of the present invention. Two-layer wiring patterns are formed previously on the releasable supporting sheet in this embodiment. On the surface of the releasable supporting sheet 431, a first layer of wiring pattern 432 is formed, on which an insulator layer 433 is formed by coating or printing. The insulator layer material is preferably an organic material such as a photosensitive epoxy resin or polyimide resin.

Then, via holes 434 are perforated at predetermined positions of the insulator layer 433 by a laser beam machine or etching, conductive paths are formed inside the via holes, and a second layer of wiring pattern 436 is formed on the surface of the insulator layer 433. Thus, the releasable supporting sheet 431 having two-layer wiring patterns is prepared. The transfer step and other steps following the above-mentioned step are the same as those in the first or second embodiment. The supporting sheet or other members are made of the same materials as in the first or second embodiment.

Three or more layer wiring patterns can be formed by a build-up method using the releasable supporting sheet 431 with two-layer wiring pattern mentioned above. By using such a releasable supporting sheet with multilayer wiring patterns, multilayer wiring patterns can be transferred onto the surface of the adhesive insulator sheet at one time, so that inexpensive multilayer PWBs can be obtained.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A printed wiring board comprising;
   at least one adhesive resin-based insulator sheet having through holes filled with a conductive material;
   at least one conductive wiring pattern, which has been transferred from a surface of a releasable supporting sheet to a surface of said adhesive resin-based insulator sheet having the through holes filled with the conductive material, connected with the conductive material in the through holes;
   a surface layer of the printed wiring board being flat and defined by one of the at least one conductive wiring pattern being embedded in one of the at least one adhesive resin-based insulator sheet so that an upper surface of the embedded wiring pattern and surrounding portions of the insulator sheet in which the wiring pattern is embedded form a flat surface so that the upper surface of the embedded wiring pattern and the insulator sheet in which the wiring pattern is embedded form a single plane, wherein the adhesive resin-based insulator sheet is made from a glass-epoxy prepreg.

2. The printed wiring board according to claim 1, wherein a width of the conductive wiring pattern transferred onto the surface of the adhesive resin-based insulator sheet is smaller than a diameter of a through hole at least where the conductive wiring pattern is overlaid on the through hole.

3. The printed wiring board according to claim 1, wherein the printed wiring board has two opposed surface layers, with both surface layers of the printed wiring board having the structure of conductive wiring pattern embedded in adhesive resin-based insulator sheet so as to form a flat surface.

4. The printed wiring board according to claim 1, wherein the printed wiring board has a single layer construction.

5. The printed wiring board according to claim 1, wherein the printed wiring board has a multiple layer construction.

6. A printed wiring board comprising:
   at least one adhesive resin-based insulator sheet having through holes filled with a conductive material;
   at least one conductive wiring pattern, which has been transferred from a surface of a releasable supporting sheet to a surface of said adhesive resin-based insulator sheet having the through holes filled with the conductive material, connected with the conductive material in the through holes;
   a surface layer of the printed wiring board being flat and defined by one of the at least one conductive wiring pattern being embedded in one of the at least one adhesive resin-based insulator sheet so that an upper surface of the embedded wiring pattern and surrounding portions of the insulator sheet in which the wiring pattern is embedded form a flat surface so that the upper surface of the embedded wiring pattern and the insulator sheet in which the wiring pattern is embedded form a single plane, wherein the adhesive resin-based insulator sheet is made of polyester or polyimide sheet coated with an adhesive or glue.

7. The printed wiring board according to claim 6, wherein a width of the conductive wiring pattern transferred onto the surface of die adhesive resin-based insulator sheet is smaller than a diameter of a through hole at least where the conductive wiring pattern is overlaid on the through hole.

8. The printed wiring board according to claim 6, wherein the printed wiring board has two opposed surface layers, with both surface layers of the printed wiring board having the structure of conductive wiring pattern embedded in adhesive resin-based insulator sheet so as to form a flat surface.

9. The printed wiring board according to claim 6, wherein the printed wiring board has a single layer construction.

10. The printed wiring board according to claim 6, wherein the printed wiring board has a multiple layer construction.

* * * * *

UNITED STATES PATENT AND TRADEMARK OFFICE
CERTIFICATE OF CORRECTION

PATENT NO. : 6,703,565 B1
DATED : March 9, 2004
INVENTOR(S) : Tsukamoto et al.

It is certified that error appears in the above-identified patent and that said Letters Patent is hereby corrected as shown below:

<u>Column 8,</u>
Line 51, "surface of die adhesive" should read -- surface of the adhesive --

Signed and Sealed this

Third Day of May, 2005

JON W. DUDAS
*Director of the United States Patent and Trademark Office*